United States Patent [19]

Furuta

[11] Patent Number: 4,953,321
[45] Date of Patent: Sep. 4, 1990

[54] FISHHOOK AND PRODUCING METHOD OF THE SAME

[76] Inventor: Yoshikazu Furuta, 116, Takiro-cho 6-chome, Tajimi-shi, Gifu-ken, Japan

[21] Appl. No.: 314,800

[22] Filed: Feb. 24, 1989

[30] Foreign Application Priority Data

Feb. 3, 1989 [JP] Japan ................................. 1-26059

[51] Int. Cl.$^5$ ............................................. A01K 83/00
[52] U.S. Cl. ................................................. 43/43.16
[58] Field of Search .......................................... 43/43.16

[56] References Cited
FOREIGN PATENT DOCUMENTS
7904556 12/1980 Netherlands ....................... 43/43.16

Primary Examiner—Kurt Rowan
Attorney, Agent, or Firm—Cushman, Darby & Cushman

[57] ABSTRACT

A fishhook is composed of a metallic base member having a shank, a bend and a point, and a TiC film layer formed on the base member by chemical vapor deposition. The fishhook has peaked projections for preventing bait from coming off the fishhook. The fishhook is produced by forming peaked projections in the surface of a metallic base member. Sharpening one end of the base member to form a point, bending the base member into a fishhook-like shape, hardening the bent base member, ultrasonic cleaning the surface of the hardened base member, and contacting the cleaned surface of the base member with a mixture gas containing evaporated titanium tetrachloride at a high temperature.

3 Claims, 2 Drawing Sheets

FISHHOOK AND PRODUCING METHOD OF THE SAME

BACKGROUND OF THE INVENTION

1. Field of the Invention

The present invention relates to a fishhook and a producing method of the same.

2. Description of the Prior Art

There has been required to provide a fishhook having excellent wear resistance and corrosion resistance, and provided with a sharp point, which can prevent bait from coming off during fishing.

Conventionally, the fishhook is produced by cutting a wire or rod-like base member made of a metallic material such as carbon steel, stainless steel and the like to have a predetermined length, sharpening a point, and a barb if provided, bending into a fishhook-like shape, hardening and tempering the fishhook-like base member, surface-treating by sandblasting, and plating the obtained surface-treated body with chrome, gold, brass or the like to increase corrosion resistance.

However, the thus produced conventional fishhook is short of hardness. During using, the conventional fishhook gradually wears to allow a fish, after initially being caught, to escape from the fishhook.

Moreover, the plated outer surface of the fishhook is porous so that the corrosion resistance is insufficient. This results in the conventional fishhook often rusting while transported by sea even if packed, and while stored in the factory for a long period after produced.

We, inventors have intensively studied to improve the wear resistance and the corrosion resistance of the fishhook. And we have succeeded in remarkable improvement in wear resistance and corrosion resistance of the fishhook by forming a surface layer of hard metallic compound such as TiC, TiN, Ti(C,N) and the like by chemical vapor deposition in place of plating with chrome or the like. (U.S. Ser. No. 222,081)

The above-described conventional fishhook has another problem in that the raw bait which is fastened to the fishhook is likely to slip off the fishhook during fishing and new bait must then be fastened to the fishhook each time this occurs.

So far, no effective measures for preventing the raw bait from slipping off the fishhook have been developed

SUMMARY OF THE INVENTION

It is an object of the present invention to provide a fishhook which can prevent raw bait from slipping off during fishing and having excellent wear resistance and corrosion resistance.

It is another object of the present invention to provide a method for producing a fishhook which can prevent bait from coming off during fishing, and having excellent wear resistance and corrosion resistance, with high productivity.

The fishhook according to the present invention is composed of a metallic base member having a plurality of projections over the entire surface of the base member and at least one film layer for covering the surface of the metallic base member, which is formed of hard metallic compound by chemical vapor deposition. The resulting fishhook has an uneven surface composed of a plurality of projections covered with at least one film layer.

This fishhook is obtained by forming a plurality of projections over the entire the surface of a wire or rod-like base member, cutting the base member into a base member having a length corresponding to that of an objective fishhook, sharpening one end of the cut base member to have a point, bending the base member into the shape like an objective fishhook, hardening and tempering the bent base member, ultrasonic cleaning the surface of the hardened and tempered base member, and forming at least one film layer made of hard metallic compound by chemical vapor deposition. It is preferable to harden and temper the obtained fishhook.

Examples of the metallic compound for forming the film layer of the fishhook of the present invention include TiC, TiN, Ti(C,N) and $Al_2O_3$. These metallic compounds are hard and excellent in wear resistance. The at least one film layer may be either a single layer or a plurality kind of layers piled on each other. The most important characteristic of the fishhook of the present invention is that the surface thereof is formed uneven. The uneven surface of the fishhook enables the secure retention of bait without coming off the fishhook.

The surface treating prior to the chemical vapor deposition is performed by ultrasonic cleaning in place of the conventional sand blasting. By virtue of the ultrasonic cleaning, oils or the like adhered to the base member can be removed and the surface can be activated without any occurrence of scratches or breaks of the sharpened point.

The chemical vapor deposition can be performed with good work efficiency by contacting the base member of the fishhook with a mixture gas containing a metal halide vapor gas within a high temperature furnace of about 800° to 1000° C. This chemical vapor deposition enables the formation of a single or multiple film layers of a uniform small thickness and high density with good adhesion to the base member. The thickness of each film layer is in the order of several microns, and in the surface of each film layer is maintained unevenness substantially identical with that of the base member.

DETAILED DESCRIPTION OF THE EMBODIMENTS

Hereinafter we will explain the present invention in accordance with several examples with reference to the drawings.

Figure 1:
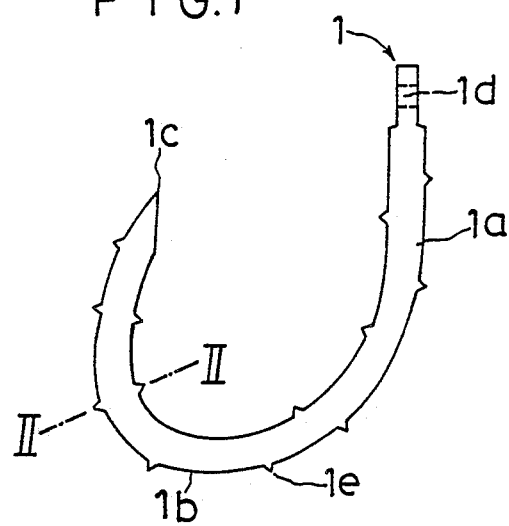
FIG. 1 is a front view of an example of a fishhook according to the present invention.

As shown in FIG. 1, a fishhook 1 has a shank 1a, a bend 1b, a point 1c and an eye 1d. And a plurality of peaked projections 1e are formed in the entire surface of the fishhook 1 in the longitudinal direction thereof.

Figure 2:
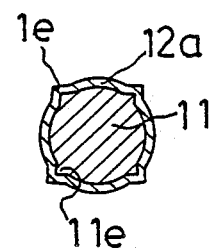
FIGS. 2, 3 and 4 are cross sectional views of examples of a fishhook according to the present invention, respectively, each being taken along the line II—II of FIG. 1.

As shown in FIG. 2, the fishhook 1 is composed of a base member 11 and a film layer 12a formed by chemical vapor deposition so as to cover the base member 11. The base member 11 is made of steel, for example carbon steel and stainless steel. The film layer 12a is made of hard metal compound such as TiC, TiN, Ti(C,N) and $Al_2O_3$. A plurality of projections 11e are formed in the surface of the base member 11, and projections 1e of substantially the same shape as the projections 11e project from the film layer 12a.

Hereinafter, we will explain the method for producing the fishhook 1 having the above-described structure.

A rod-like base member of 0.5 mm to 10 mm in diameter is formed of carbon steel by drawing. A die for drawing is provided with a plurality of concave grooves. The drawn base member has a plurality of projecting ridges spaced from each other, and extending in the longitudinal direction thereof. These projecting ridges are crushed by press working with the exception of predetermined portions. This results in the projections 1e being formed in uncrushed predetermined portions.

Then, the base member with the projections 11e is cut to have a predetermined length corresponding to that of the fishhook 1. In one end of the obtained base member 11 is formed the sharp point 1c by polishing or press working, and in the other end of the base member 11 is formed the eye 1d.

Next, the base member 11 having the sharp point 1c and the eye 1d is subjected to bending to have a fishhook-like shape. The bent base member 11 is subjected to hardening and tempering.

On the thus obtained base member 11 is formed the film layer 12a in the following manner.

In forming the TiC film layer 12a, at first, the base member 11 is cleaned by ultrasonic cleaning. Then, the cleaned base member 11 is heated in hydrogen gas to remove remaining oils or the like from the surface of the base member 11 and activate the surface thereof. Next, the activated base member 11 is heated in high temperature mixture gas of evaporated titanium tetrachloride as metal halide with hydrogen gas and methane gas at about 1000° C. In this step, the mixture gas reacts on the surface of the base member 11 to form the TiC film layer 12a thereon. TiC film layer shows dull gray and has a hardness(Hv) of 32000 at a normal temperature. Accordingly, it exhibits excellent abrasion resistance. The obtained TiC film layer 12a is firmly joined to the base member 11.

In forming the TiN film layer, the base member 11 is cleaned and activated in the identical manner with the case of the TiC film. Then, the activated base member 11 is heated in a mixture gas of evaporated titanium tetrachloride with hydrogen gas and nitrogen gas at about 800° to 850° C. This results in the mixture gas reacting on the surface of the base member 11 to form the TiN film layer thereon. TiN film layer shows shiny gold and has a hardness(Hv) of 2450 at a normal temperature. TiN film layer is excellent in both oxidation resistance and lubrication characteristic.

In forming the Ti(C,N) film layer, the base member 11 is cleaned and activated, and then, the activated base member 11 is heated in a mixture gas composed of evaporated titanium tetrachloride, methane gas, hydrogen gas and nitrogen gas at about 800° to 1000° C. This results in the mixture gas reacting on the surface of the base member 11 to form the Ti(C,N) film layer thereon.

Ti(C,N) is a solid solution of TiC and TiN, and the composition of Ti(C,N) can be voluntarily changed by changing the ratio of methane gas and nitrogen gas within the mixture gas. Ti(C,N) has both properties of TiC and TiN.

Figure 3:
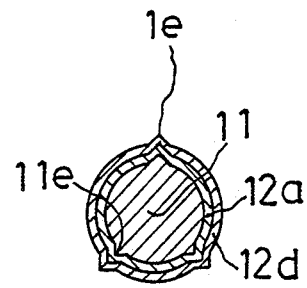

Aluminum oxide is excellent in both oxidation resistance and abrasion resistance so as to be preferably used as the material for the film layer of the fishhook. However, it is technically difficult to form an aluminum oxide film layer directly on the surface of the base member 11. Accordingly, as shown in FIG. 3, the TiC film layer 12a is previously formed on the surface of the base member 11, and an aluminum oxide film layer 12d is formed on the TiC film layer 12a.

Namely, the base member 11 on which the TiC film layer 1a is formed, is heated in a mixture gas of evaporated aluminum chloride($AlCl_3$), carbon dioxide gas and a small amount of hydrogen gas at about 1000° C. This results in the $Al_2O_3$ film layer 12d being formed on the TiC film layer 12a. $Al_2O_3$ film layer shows silvery white and has a hardness(Hv) of 2380 at a normal temperature.

Figure 4:
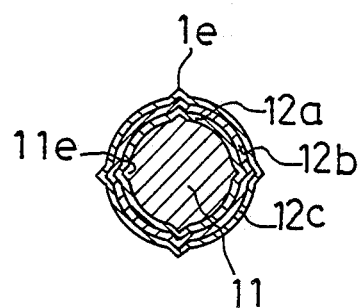

In the fishhook shown in FIG. 4, a TiC film layer 12a, a Ti(C,N) film layer 12b and a TiN film layer 12C are successively formed on the base member 11.

This fishhook is excellent in lubrication characteristic, oxidation resistance, and abrasion resistance.

The fishhook of the preceding examples is not provided with a barb near the point thereof. However, the present invention is applicable to the fishhook provided with the barb.

The shape of the projections formed in the surface of the fishhook is not limited to that of the fishhook of the present embodiment. Such a shape as to prevent the bait from coming off the fishhook will do. For example, projecting ridges can be formed in the surface of the fishhook in the peripheral direction thereof so as to spaced from each other by a predetermined distance in the longitudinal direction thereof.

The fishhook of the present invention is superior to the conventional fishhook in both oxidation resistance and abrasion resistance owing to the provision of the film layer. Therefore, the fishhook according to the present invention can be used for a long period of time. The uneven surface of the fishhook acts to prevent the bait from coming off the fishhook, and accordingly can save trouble of frequently refixing bait to the fishhook during fishing.

As described above, according to the present invention, the film layer is formed by chemical vapor deposition. This method is excellent in work efficiency so as to be suitable to mass production.

Moreover, because the surface treatment prior to the formation of the film layer is performed by ultrasonic cleaning, the sharpened point is prevented from being scratched or broken during surface treatment.

In addition, because the chemical vapor deposition enables the formation of a uniform and thin film layer, the projections formed in the surface of the base member are covered with the film layer without change in shape.

What is claimed is:

1. A fishhook comprising:
    (a) a metallic base member having a fishhook-like shape provided with a shank, a bend and a point, and
    (b) at least one film layer made of a hard metallic compound formed on said base member by chemical vapor deposition,
    said metallic base member having a plurality of projections distributed over an entire surface of said base member thereby,
    said fishhook having an uneven surface composed of said plurality of projections on which said at least one film layer is formed.

2. A fishhook according to claim 1, wherein said at least one film layer is composed of a single or multiple film layers, each of which is made of a material selected from the group consisting of TiC, TiN and Ti(C,N).

3. A fishhook according to claim 2, wherein said at least one film layer is further composed of an $Al_2O_3$ film layer formed on said single or multiple film layers.

* * * * *